United States Patent
Kim et al.

(10) Patent No.: US 10,938,398 B2
(45) Date of Patent: Mar. 2, 2021

(54) ANALOG-TO-DIGITAL CONVERTER AND MICROPHONE INCLUDING THE SAME

(71) Applicant: Seoul National University R&DB Foundation, Seoul (KR)

(72) Inventors: Suhwan Kim, Seoul (KR); Junsoo Cho, Seoul (KR); Youngtae Yang, Seoul (KR)

(73) Assignee: Seoul National University R&DB Foundation, Seoul (KR)

(*) Notice: Subject to any disclaimer, the term of this patent is extended or adjusted under 35 U.S.C. 154(b) by 0 days.

(21) Appl. No.: 16/790,598

(22) Filed: Feb. 13, 2020

(65) Prior Publication Data
US 2020/0186157 A1    Jun. 11, 2020

Related U.S. Application Data

(63) Continuation of application No. PCT/KR2018/009889, filed on Aug. 28, 2018.

(30) Foreign Application Priority Data

Sep. 5, 2017 (KR) .................. 10-2017-0113585

(51) Int. Cl.
| | |
|---|---|
| H03M 1/00 | (2006.01) |
| H03M 1/06 | (2006.01) |
| H03M 1/18 | (2006.01) |
| H03M 1/42 | (2006.01) |
| H04R 19/04 | (2006.01) |
| H03M 3/00 | (2006.01) |

(52) U.S. Cl.
CPC ......... *H03M 1/001* (2013.01); *H03M 1/0626* (2013.01); *H03M 1/183* (2013.01); *H03M 1/42* (2013.01); *H04R 19/04* (2013.01); *H03M 1/002* (2013.01); *H03M 3/346* (2013.01); *H03M 3/424* (2013.01); *H04R 2201/003* (2013.01)

(58) Field of Classification Search
CPC .... H03M 1/001; H03M 1/0626; H03M 1/183; H03M 1/42; H03M 3/346; H03M 3/424; H03M 1/002; H03M 1/129; H04R 2201/003; H04R 19/04
USPC .......................................... 341/110, 143, 155
See application file for complete search history.

(56) References Cited

U.S. PATENT DOCUMENTS

| | | | |
|---|---|---|---|
| 9,100,032 B2* | 8/2015 | Straeussnigg | ............ H04R 3/00 |
| 9,297,826 B2 | 3/2016 | Fang et al. | |
| 9,356,567 B2* | 5/2016 | Mortensen | ............ H03F 3/187 |
| 2006/0097899 A1 | 5/2006 | Nagai | |

(Continued)

FOREIGN PATENT DOCUMENTS

| | | |
|---|---|---|
| KR | 1020040111385 A | 12/2004 |
| KR | 100925397 B1 | 11/2009 |

(Continued)

*Primary Examiner* — Khai M Nguyen
(74) *Attorney, Agent, or Firm* — William Park & Associates Ltd.

(57) ABSTRACT

An analog-to-digital converter (ADC) includes a first operator configured to subtract an analog value from an analog signal; an amplifier configured to amplify an output of the first selector; a filter configured to filter an output of the amplifier; a quantizer configured to generate a digital bit stream from an output of the filter; and a digital-to-analog converter (DAC) configured to output the analog value according to the digital bit stream.

10 Claims, 5 Drawing Sheets

(56) References Cited

U.S. PATENT DOCUMENTS

2014/0250971 A1   9/2014  Fang et al.
2016/0097899 A1   4/2016  Lin et al.

FOREIGN PATENT DOCUMENTS

| KR | 1020130092479 A | 8/2013 |
| KR | 1020160117590 A | 10/2016 |
| KR | 101738266 B1 | 5/2017 |

* cited by examiner

<Prior Art>

ANALOG-TO-DIGITAL CONVERTER AND MICROPHONE INCLUDING THE SAME

CROSS-REFERENCE TO RELATED APPLICATIONS

This application is a continuation of and claims priority to PCT application No. PCT/KR2018/009889, filed on Aug. 28, 2018, which claims priority to Korean Patent Application No. 10-2017-0113585, filed on Sep. 5, 2017, which is incorporated herein by reference in its entirety.

BACKGROUND

1. Technical Field

Various embodiments generally relate to an analog-to-digital converter (ADC) and a microphone including the ADC.

2. Related Art

FIG. 1 shows an ADC 10 and a microphone 1 including the ADC 10 according to a conventional art.

The conventional microphone 1 includes a MEMS device 20 and the ADC 10 for converting an output of the MEMS device 20 into a digital signal.

The MEMS device 20 outputs an electrical signal corresponding to a sound signal IN.

The ADC 10 outputs a digital signal OUT corresponding to the electrical signal output from the MEMS device 20.

In FIG. 1, the ADC 10 uses a sigma-delta modulation scheme.

The ADC 10 includes an amplifier 11 for amplifying an output of the MEMS device 20, an operator 12 for subtracting an output of the digital-to-analog converter (DAC) 15 from an output of the amplifier 11, and a filter 13 for filtering an output of the operator 12, a quantizer 14 for converting an output of the filter 13 to a digital bit stream, a DAC 15 for converting the digital bit stream to an analog value, and a decimator 16 for converting the digital bit stream into the digital signal OUT.

The amplifier 11 may be implemented using a source follower or a charge amplifier.

In the conventional configuration as shown in FIG. 1, the output of the MEMS device 20 is amplified by the amplifier 11, but the output of the amplifier 11 cannot be out of the range of the power supply voltage.

Accordingly, when the magnitude of the signal output from the MEMS device 20 increases, a section among the output of the amplifier 11 that saturates at the maximum voltage may exist.

This distortion of the signal causes a problem that harmonic components of the output signal increases, which degrades signal quality.

SUMMARY

In accordance with the present teachings, an analog-to-digital converter (ADC) may include a first operator configured to subtract an analog value from an analog signal; an amplifier configured to amplify an output of the first selector; a filter configured to filter an output of the amplifier; a quantizer configured to generate a digital bit stream from an output of the filter; and a digital-to-analog converter (DAC) configured to output the analog value according to the digital bit stream.

In accordance with the present teachings, an analog-to-digital converter (ADC) may include a first operator configured to subtract an analog value from an analog signal; a detector configured to output a selection signal according to magnitude of the analog signal; a first selector configured to select the analog signal or an output of the first operator according to the selection signal; an amplifier configured to amplify an output of the first selector; a second operator configured to subtract the analog value from an output signal from the amplifier; a second selector configured to select the output of the amplifier or an output of the second operator according to the selection signal; a filter configured to filter an output of the second selector; a quantizer configured to generate a digital bit stream from an output of the filter; and a digital-to-analog converter (DAC) configured to output the analog value according to the digital bit stream.

In accordance with the present teachings, a microphone may include a MEMS device configured to output an analog signal from a sound signal; and an analog-to-digital converter (ADC) configured to output a digital signal from the analog signal, wherein the ADC comprises a first operator configured to subtract an analog value from the analog signal; a detector configured to output a selection signal according to magnitude of the analog signal; a first selector configured to select the analog signal or an output of the first operator according to the selection signal; an amplifier configured to amplify an output of the first selector; a second operator configured to subtract the analog value from an output signal from the amplifier; a second selector configured to select the output of the amplifier or an output of the second operator according to the selection signal; a filter configured to filter an output of the second selector; a quantizer configured to generate a digital bit stream from an output of the filter; and a digital-to-analog converter (DAC) configured to output the analog value according to the digital bit stream.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 2:
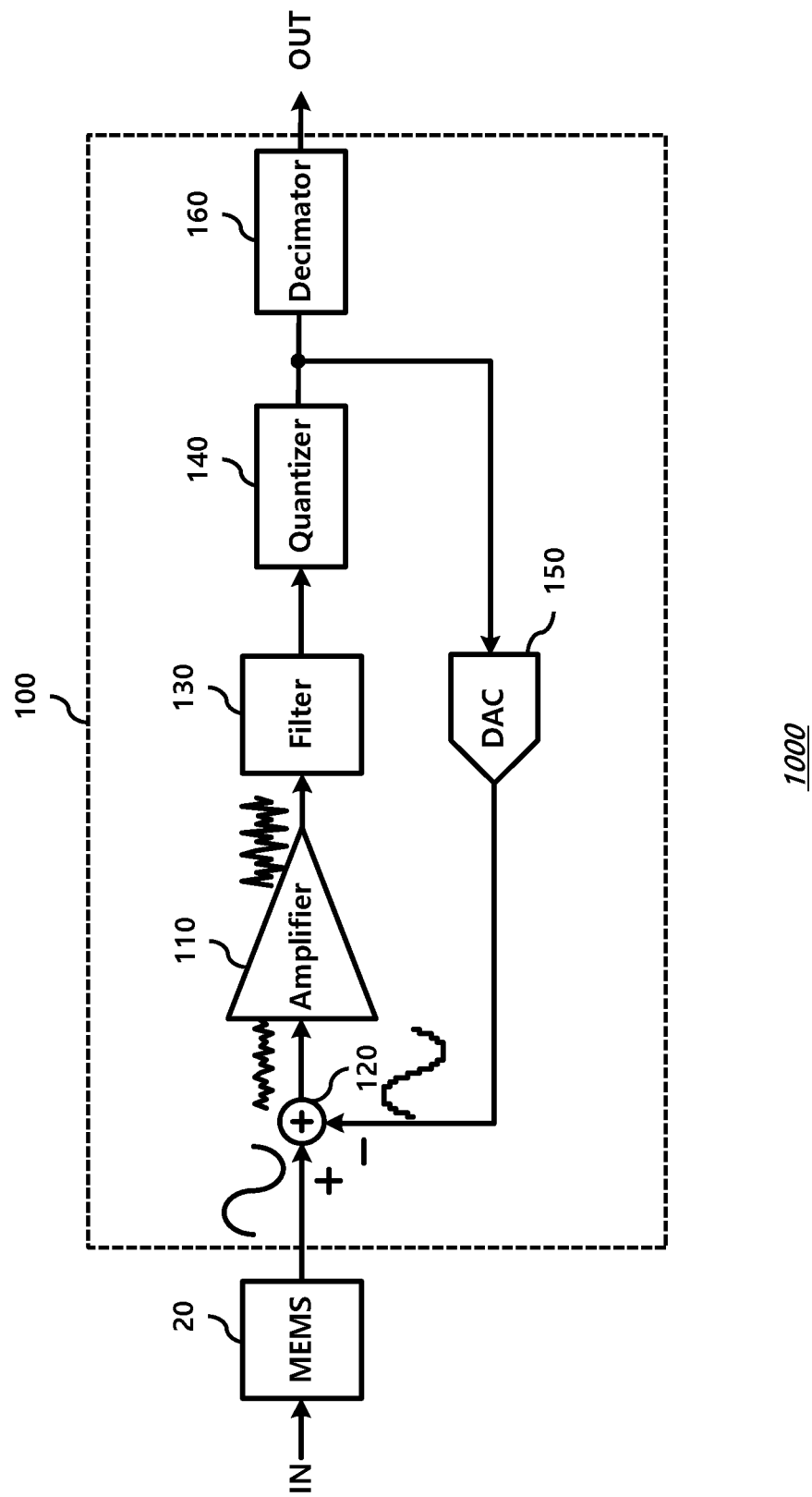
FIG. 2 shows a block diagram of an ADC and a microphone including the ADC according to an embodiment of the present disclosure.

FIG. 2 is a block diagram of an analog-to-digital converter (ADC) 100 and a microphone 1000 including the ADC 100 according to an embodiment of the present disclosure.

The MEMS device 20 outputs an electrical signal corresponding to the sound signal IN.

The ADC 100 outputs a digital signal OUT corresponding to the electrical signal output from the MEMS device 20.

In FIG. 2, the ADC 100 includes a sigma-delta modulator.

The ADC 100 includes an operator 120 for subtracting an output of a digital-to-analog converter (DAC) 150 from the output of the MEMS device 20, an amplifier 110 for amplifying an output of the operator 120, a filter 130 for filtering an output of the amplifier 110, a quantizer 140 for converting an output of the filter 130 into a digital bit stream, the DAC 150 for converting the digital bit stream into an analog value such as an analog voltage, and a decimator 160 for converting the digital bit stream into the digital signal OUT.

In the embodiment of FIG. 2, the amplifier 110 amplifies the output of the operator 120 rather than the output of the MEMS device 20.

The output of the operator 120 corresponds to quantization noise, so the amplitude thereof is very small.

Accordingly, it is very unlikely that the amplitude of the signal output from the amplifier 110 will be saturated beyond the power supply voltage, and thus, the digital signal OUT is less likely to be distorted.

Amplifier 110 may be implemented using a source follower or a charge amplifier.

In this case, in order to perform the subtraction of the analog voltage output from the DAC 150 from the output of the MEMS device 20, the operator 120 may be implemented in a manner further including a capacitor for converting the analog voltage into a charge amount.

However, when the amplitude of the analog signal output from the MEMS device 20 is relatively small, that is, when the digital signal OUT output from the decimator 160 has a relatively small value, quality of the entire signal can be greatly affected due to noise occurring in a capacitor included in the operator 120.

Accordingly, an ADC 100 may be set to function as in FIG. 2 when the signal output from the MEMS device 20 exceeds a predetermined level.

Figure 3:
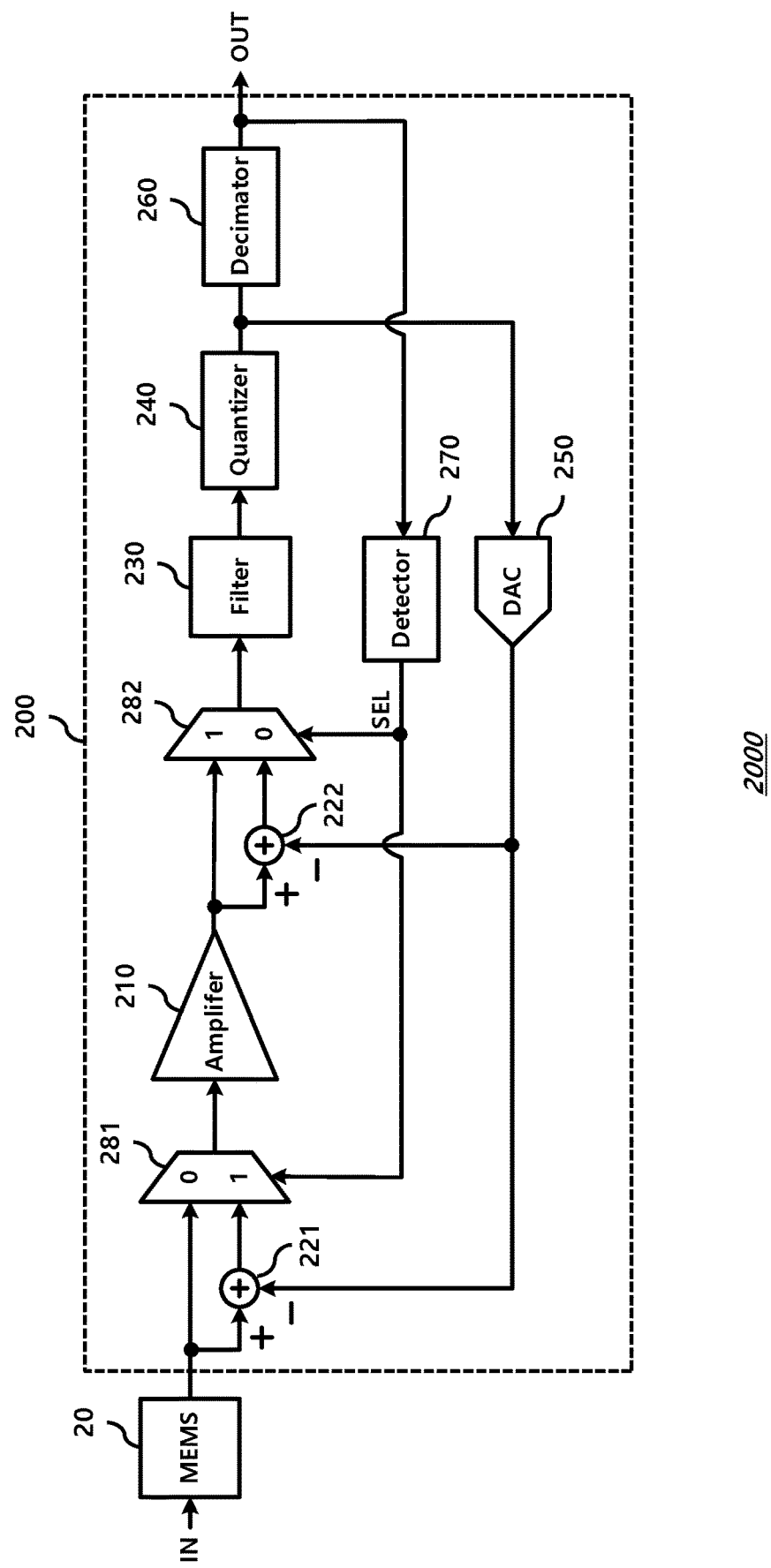
FIG. 3 shows a block diagram of an ADC and a microphone including the ADC according to an embodiment of the present disclosure.

FIG. 3 is a block diagram of an ADC 200 and a microphone 2000 including the ADC 200 according to an embodiment of the present disclosure.

The ADC 200 includes a first amplifier 221 for subtracting an output of a DAC 250 from an output of the MEMS device 20, an amplifier 210 for amplifying an output of a first selector 281, a second operator 222 for subtracting the output of a DAC 250 from an output of the amplifier 210, a filter for filtering an output of a second selector 282, a quantizer 240 for converting an output of the filter 230 into a digital bit stream, the DAC 250 for converting the digital bit stream to an analog value such as an analog voltage, and a decimator 260 for converting the digital bit stream into a digital signal OUT.

The ADC 200 further includes the first operator 281 that selects the output of the MEMS device 20 when the selection signal SEL is logic 0, and selects the output of the first operator 221 when the selection signal SEL is logic 1.

The ADC 200 further includes the second selector 282 that selects the output of the amplifier 210 when the selection signal SEL is logic 1, and selects the output of the second operator 222 when the selection signal SEL is logic 0.

The ADC 200 further includes a detector 270 that outputs the selection signal SEL.

The detector 270 determines whether the output of the MEMS device 20 is equal to or less than a predetermined value.

To this end, the detector 270 determines whether the digital signal OUT corresponding to the output signal of the MEMS device 20 is less than or equal to a threshold value.

The selection signal SEL becomes a signal of logic 0 when the magnitude of the digital signal OUT is equal to or less than the threshold value and becomes a signal of logic 1 otherwise.

That is, when the magnitude of the digital signal OUT is less than or equal to the threshold value, the first selector 281 selects the output of the MEMS device 20, and the second selector 282 selects the output of the second operator 222.

Figure 1:
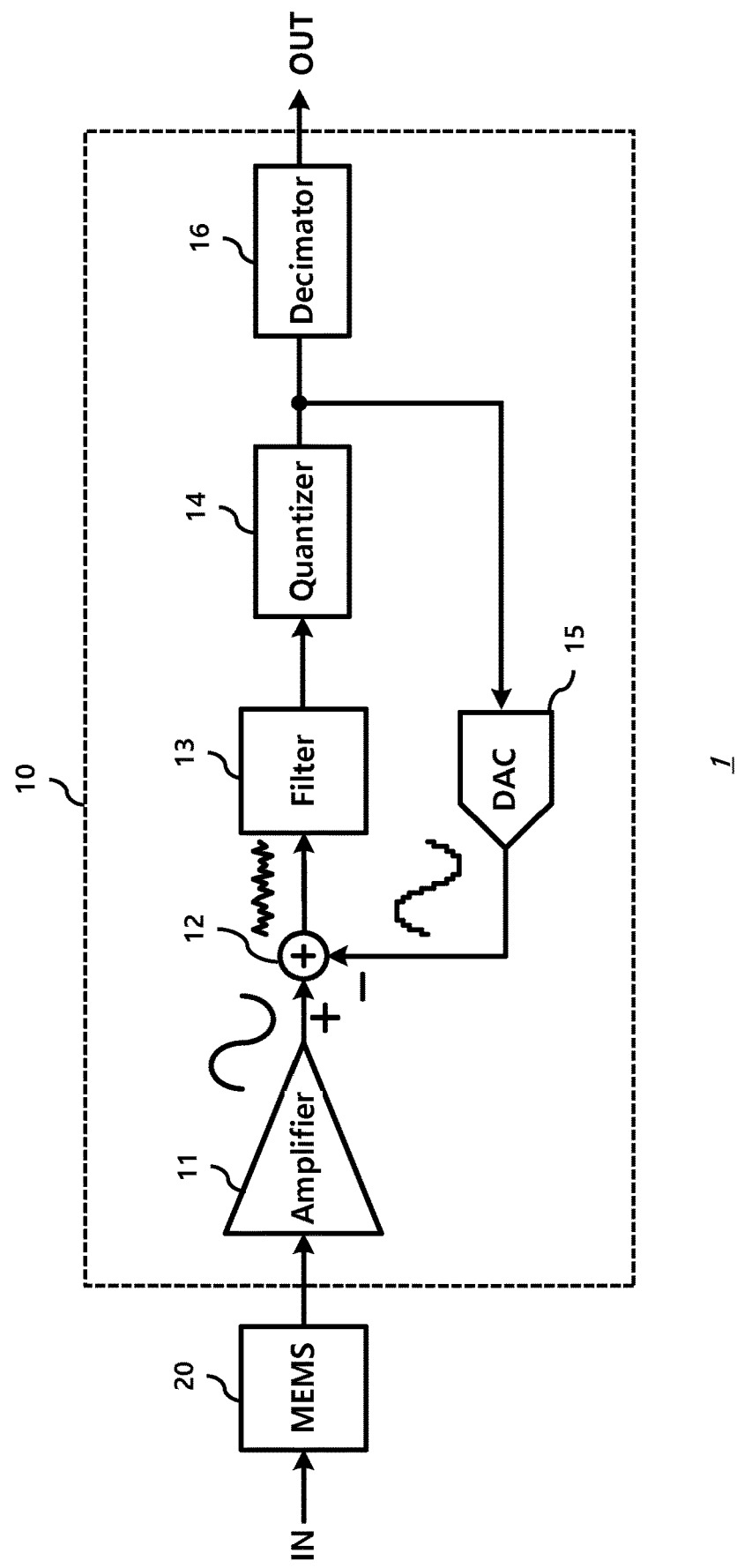
FIG. 1 shows a block diagram of an analog-to-digital converter (ADC) and a microphone including the ADC according to a prior art.

Accordingly, when the magnitude of the digital signal OUT is less than or equal to the threshold value, the ADC 200 operates like the conventional ADC 10 of FIG. 1.

On the contrary, when the magnitude of the digital signal OUT is greater than the threshold value, the first selector 281 selects the output of the first operator 221, and the second selector 282 selects the output of the amplifier 210.

Accordingly, when the magnitude of the digital signal OUT is greater than the threshold value, the ADC 200 operates like the ADC 100 of FIG. 2.

The first operator 221 may comprise a capacitor for converting the analog voltage from the DAC 250 into charge amount like the operator 120 included in the embodiment illustrated in FIG. 2.

In the embodiment of FIG. 3, when the size of the digital signal OUT is small, the output of the first operator 221 is not used, thereby reducing the influence of noise.

The detector 270 detects the magnitude of the digital signal OUT output from the decimator 260 and outputs a selection signal SEL.

Figure 4:
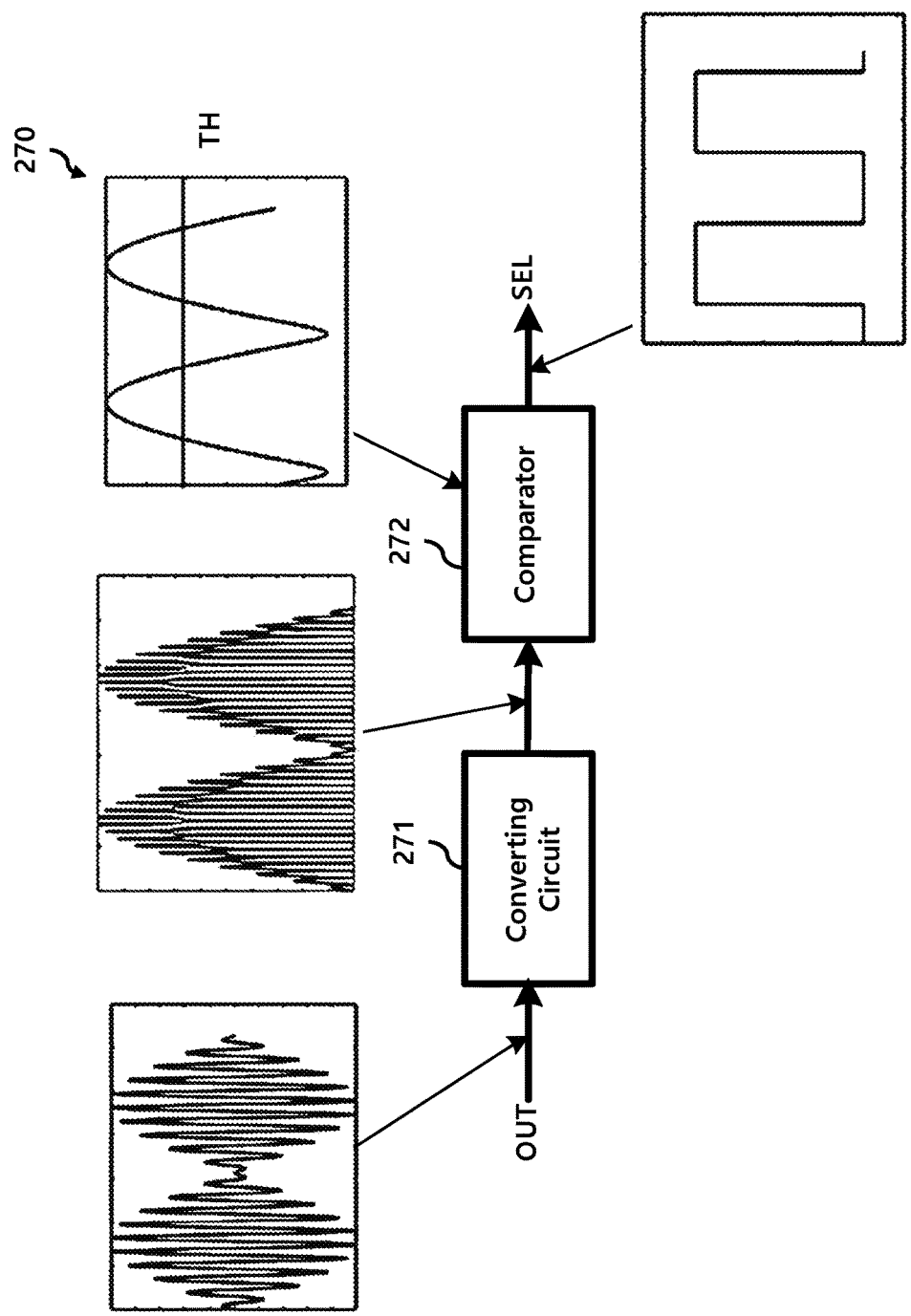
FIG. 4 shows a block diagram of a detector according to an embodiment of the present disclosure.

FIG. 4 shows a block diagram illustrating the detector 270 according to an embodiment of the present disclosure.

The detector 270 includes a converting circuit 271 and a comparator 272.

The converting circuit 271 outputs an amplitude signal having a value corresponding to the amplitude of the digital signal OUT.

The graph of FIG. 4 is shown as a continuous graph, which approximates discrete signals extracted from the digital signal OUT.

The comparator 272 performs a low-pass filtering on the amplitude signal and compares a result of the low-pass filtering with the threshold value TH to output a selection signal SEL.

Through low-pass filtering, an envelope of the amplitude signal can be obtained.

The selection signal SEL has a logic 0 when the envelope is below the threshold value TH and has a logic 1 when the envelope is above the threshold value TH.

Figure 5:
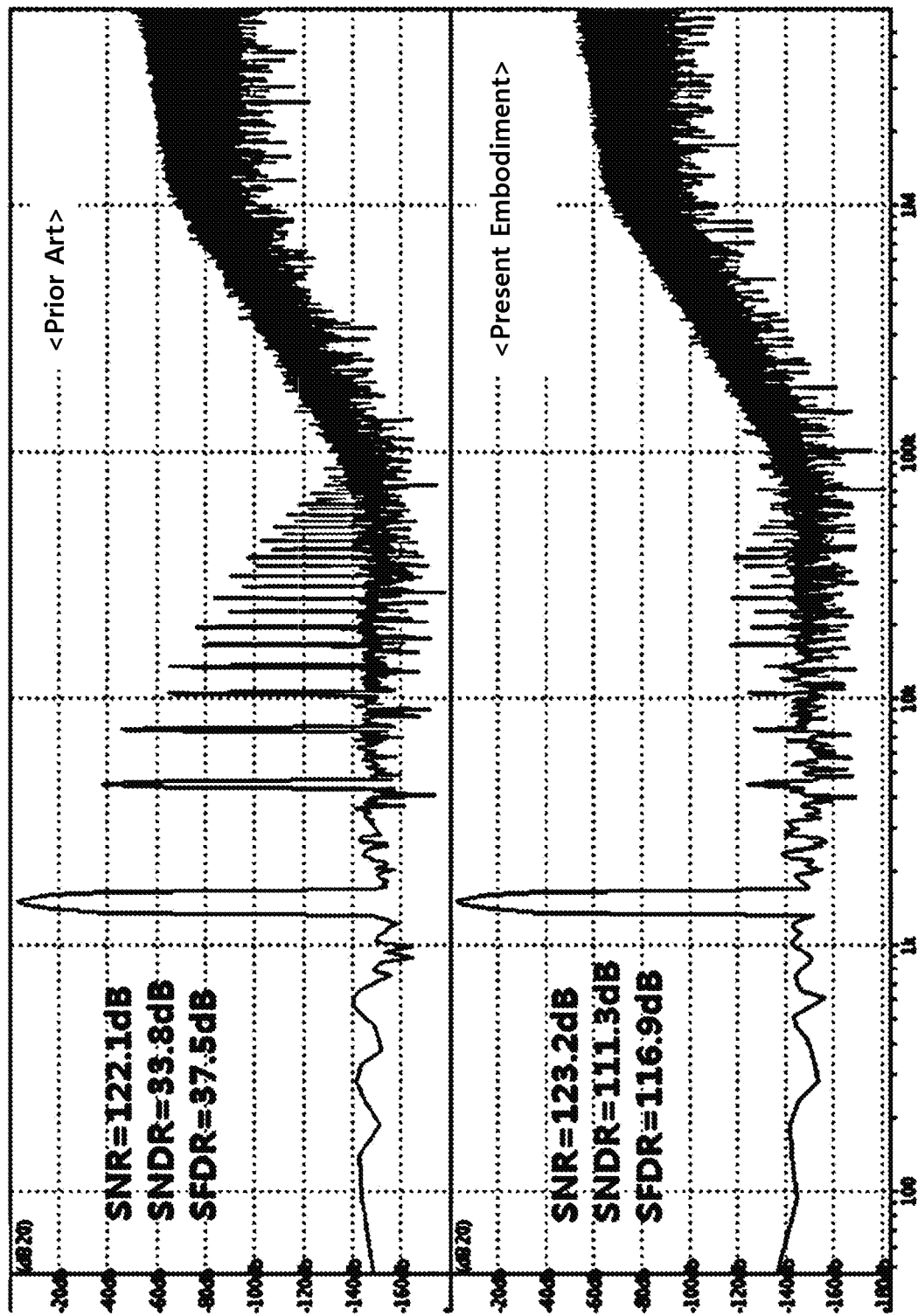
FIG. 5 shows a graph illustrating effect of an embodiment of the present disclosure.

FIG. 5 shows a graph illustrating effect of an embodiment of the present disclosure.

The simulation result in FIG. 5 assumes that a signal of a 1.5 KHz sine wave is output from the MEMS device 20.

In case of a prior art as shown in FIG. 1, harmonic components corresponding to multiples of 1.5 KHz are generated, but the harmonic components are not generated in the present embodiment.

The Signal-to-Total-Noise and Distortion Ratio (SNDR) is greatly improved to 111.3 dB in the present embodiment from 33.8 dB in the prior art.

In addition, the Spurious Free Dynamic Range (SFDR), which is a value obtained by comparing magnitude of a signal with magnitude of a maximum spur, is greatly improved to 116.9 dB in the present embodiment from 37.5 dB in the prior art.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. An analog-to-digital converter (ADC) comprising:
   a first operator configured to subtract an analog value from an analog signal;
   a detector configured to output a selection signal according to magnitude of the analog signal;
   a first selector configured to select the analog signal or an output of the first operator according to the selection signal;
   an amplifier configured to amplify an output of the first selector;
   a second operator configured to subtract the analog value from an output signal from the amplifier;
   a second selector configured to select the output of the amplifier or an output of the second operator according to the selection signal;
   a filter configured to filter an output of the second selector;
   a quantizer configured to generate a digital bit stream from an output of the filter; and
   a digital-to-analog converter (DAC) configured to output the analog value according to the digital bit stream,
   wherein the first selector selects the analog signal and the second selector selects an output of the second operator when the analog signal is less than a predetermined value and the first selector selects an output of the first operator and the second selector selects an output of the amplifier when the analog signal is greater than the predetermined value.

2. The ADC of claim 1, further comprising a decimator configured to output a digital signal from the digital bit stream.

3. The ADC of claim 2, wherein the detector generates the selection signal by comparing magnitude of the digital signal with a threshold value.

4. The ADC of claim 3, wherein the detector comprises a converting circuit configured to output a magnitude signal corresponding to magnitude of the digital signal and a comparator configured to output the selection signal by comparing an envelope detected from the magnitude signal with the threshold value.

5. The ADC of claim 4, wherein the comparator comprises a low-pass filter detecting the envelope from the magnitude signal.

6. A microphone comprising:
   a MEMS device configured to output an analog signal from a sound signal; and
   an analog-to-digital converter (ADC) configured to output a digital signal from the analog signal,
   wherein the ADC comprises:
   a first operator configured to subtract an analog value from the analog signal;
   a detector configured to output a selection signal according to magnitude of the analog signal;
   a first selector configured to select the analog signal or an output of the first operator according to the selection signal;
   an amplifier configured to amplify an output of the first selector;
   a second operator configured to subtract the analog value from an output signal from the amplifier;
   a second selector configured to select the output of the amplifier or an output of the second operator according to the selection signal;
   a filter configured to filter an output of the second selector;
   a quantizer configured to generate a digital bit stream from an output of the filter; and
   a digital-to-analog converter (DAC) configured to output the analog value according to the digital bit stream,
   wherein the first selector selects the analog signal and the second selector selects an output of the second operator when the analog signal is less than a predetermined value and the first selector selects an output of the first operator and the second selector selects an output of the amplifier when the analog signal is greater than the predetermined value.

7. The microphone of claim 6, further comprising a decimator configured to output the digital signal from the digital bit stream.

8. The microphone of claim 7, wherein the detector generates the selection signal by comparing magnitude of the digital signal with a threshold value.

9. The microphone of claim 8, wherein the detector comprises a converting circuit configured to output a magnitude signal corresponding to magnitude of the digital signal and a comparator configured to output the selection signal by comparing an envelope detected from the magnitude signal with the threshold value.

10. The microphone of claim 9, wherein the comparator comprises a low-pass filter detecting the envelope from the magnitude signal.

* * * * *